United States Patent [19]

Zampini

[11] Patent Number: 5,571,886
[45] Date of Patent: Nov. 5, 1996

[54] AROMATIC NOVOLAK RESINS

[75] Inventor: Anthony Zampini, Westborough, Mass.

[73] Assignee: Shipley Company, Inc., Marlborough, Mass.

[21] Appl. No.: 215,890

[22] Filed: Mar. 21, 1994

Related U.S. Application Data

[60] Continuation of Ser. No. 988,854, Dec. 10, 1992, abandoned, which is a division of Ser. No. 600,862, Oct. 22, 1990, Pat. No. 5,216,111, which is a continuation-in-part of Ser. No. 411,670, Sep. 25, 1989, abandoned, which is a continuation of Ser. No. 108,192, Oct. 13, 1987, abandoned, which is a continuation-in-part of Ser. No. 2,364, Dec. 23, 1986, abandoned.

[51] Int. Cl.[6] ................................................. C08G 8/04
[52] U.S. Cl. ........................ 528/143; 528/129; 528/144; 528/151; 528/153; 528/155; 528/165; 525/504; 430/192
[58] Field of Search ......................... 528/129, 143, 528/144, 155, 151, 153, 165; 525/504; 430/192

[56] References Cited

U.S. PATENT DOCUMENTS

| | | | |
|---|---|---|---|
| 2,437,710 | 3/1948 | Hamilton | 528/212 |
| 4,529,682 | 7/1985 | Toukhy | 430/190 |
| 4,614,826 | 9/1986 | Katayama et al. | 556/131 |
| 4,649,188 | 3/1987 | Bertram et al. | 528/165 |
| 4,650,741 | 3/1987 | Miura et al. | 430/192 |
| 4,690,882 | 9/1987 | Tanigaki et al. | 430/192 |
| 4,797,346 | 1/1989 | Yamamoto et al. | 430/192 |
| 4,983,492 | 1/1991 | Trefonas III et al. | 430/191 |
| 5,130,409 | 7/1992 | Lazarus et al. | 528/155 |
| 5,130,410 | 7/1992 | Zampini | 528/218 |
| 5,178,986 | 1/1993 | Zampini | 430/190 |
| 5,266,440 | 11/1993 | Zampini | 430/192 |

FOREIGN PATENT DOCUMENTS 60-143345  7/1985  Japan .

OTHER PUBLICATIONS

Hiraoka et al. "Functionally Substituted Novolak Resins: Lithographic Applications, Radiation Chemistry, and Photooxidation," *Materials for Microlithography*, Am. Chem. Soc., Wash. D.C., 1984, pp. 322–323.

Hiraoka et al., Am Chem Soc., Div Poly. Chem, vol. 25, #1, 1984 pp. 322–323.

*Primary Examiner*—Samuel A. Acquah
*Attorney, Agent, or Firm*—Robert L. Goldberg

[57] ABSTRACT

An essentially aromatic alkali soluble novolak resin comprising the product resulting from the acid condensation of an aromatic aldehyde and a phenol where the resin has a molecular weight in excess of 1500 and a glass transition temperature in excess of 125° C. If desired, the aromatic novolak resin may be blended with a conventional novolak resin to regulate the glass transition temperature of the resin. The aromatic novolak resin and blends formed therefrom are especially suitable as coating resins and are useful for the formation of photoresist coating compositions.

13 Claims, No Drawings

AROMATIC NOVOLAK RESINS

CROSS REFERENCE TO RELATED APPLICATIONS

This is a continuation of application Ser. No. 07/988,854 filed on Dec. 10, 1992, now abandoned, which is a divisional of application Ser. No. 07/600,862 filed on Oct. 22, 1990, now U.S. Pat. No. 5,216,111, which is a continuation-in-part of U.S. patent application Ser. No. 07/411,670 filed Sep. 25, 1989, now abandoned, which application in turn is a continuation of U.S. patent application Ser. No. 07/108,192 filed Oct. 13, 1987 (now abandoned) which latter application is a continuation-in-part of U.S. patent application Ser. No. 002,364 filed Dec. 23, 1986 (now abandoned).

BACKGROUND OF THE INVENTION

1. Introduction

This invention relates to novel novolak resins formed from phenols and aromatic aldehydes, to blends of the same with other resins including conventional novolak resins and to a novel process for making said new novolak resins.

2. Description of the Prior Art

The formation of phenolic resins by condensation of a phenol with an aldehyde is well known in the art and described in numerous publications including *Kirk-Othmer Encyclopedia of Chemical Technology*, Volume 15, pages 176 to 208, 1968, incorporated herein by reference. Phenol itself is the phenol used in the greatest volume for the formation of phenolic resins, but resorcinol, alkyl substituted phenols such as cresols, xylenols, and p-tert-butylphenol and p-phenylphenol are used in substantial volume. The aldehyde used is almost exclusively formaldehyde, but small amounts of acetaldehyde and furfuraldehyde have also been used.

The condensation of a phenol with an aldehyde can be an acid catalyzed reaction with a molar ratio of aldehyde to phenol less than 1 or an alkaline catalyzed reaction with a molar ratio of aldehyde to phenol greater than 1. The acid catalyzed reaction yields thermoplastic resins which have come to be known in the art as the novolak resins while the alkaline catalyzed reactions yield thermosetting resins known as the resole resins.

The novolak resins have many commercial uses. Their primary use is as a molding compound where they are molded to a desired configuration and then cured by crosslinking with a crosslinking agent such as hexamethylene tetramine. Another use of the novolak resins is as a film forming material in a coating composition. For this use, the resin is cast from solution and generally the cast film is not cured.

Conventional novolak resins, prior to cure, have only moderate thermal stability and typically melt within a range of from about 90° C. to 120° C., dependent upon the composition of the resin and its molecular weight. There has been little effort to increase the stability of the thermoplastic novolak resins to high temperatures because high thermal stability has not been considered to be an important property of a film forming resin.

A new class of novolak resins formed by condensation of a mixture of a naphthol and a phenol with an aldehyde is disclosed in U.S. Pat. No. 4,424,315. These resins are copolymers formed by the aforesaid condensation of an aldehyde with an aromatic alcohol mixture of a naphthol and a phenol in the presence of an acid catalyst. The molar ratio of the naphthol to the phenol can vary from about 20 to 1 to 1 to 20 dependent upon the desired properties of the resin. These resins were prepared for use as a binder for a photoresist and show improved resistance to flow at elevated temperatures, though it was found that a photoresist formulated with this resin was difficult to develop.

In *Materials for Microlithography*, L. F. Thompson, G. G. Wilson, and J. M. Frechet; Eds.; ACS Symposium Series 266, American Chemical Society, Washington, D.C., 1984, Chapter 17, page 339, a meta-cresol-benzaldehyde novolak resin was formulated with a photosensitizer and solvent to produce positive toned images when the mixture was applied to a silicon wafer, exposed to actinic radiation and subsequently developed. However, the synthesis of the cresol-benzaldehyde novolak resin, as taught, produced a material having low molecular weight, and photoresist compositions based on it had low photospeed, low resolution and inadequate temperature resistance.

In U.S. Pat. No. 4,943,511, there is disclosed and claimed a positive photoresist composition which uses a resin binder that is prepared from a phenolic component having a high p-cresol content and an aldehyde that is a mixture of formaldehyde and an aromatic aldehyde. In accordance with the patent, photoresists formulated using the aforesaid resins as binders possess improved resolution capabilities, but it is believed that the resins of the patent exhibit only minimal or no thermal improvement compared to prior art novolak resins.

SUMMARY OF THE INVENTION

The subject invention directed to new resins comprising the condensation product of a phenol and an aromatic aldehyde, mixtures of such resin with other phenolic resins including conventional novolak resins—i.e., those prepared by the reaction of a phenol with formaldehyde in the presence of an acid catalyst, and to a new method for the formation of said aromatic novolak resins.

The new resins of the invention exhibit glass transition temperatures in excess of 125° C. and many exhibit glass transition temperatures as high as 175° C. or higher. The novel resins are suitable for use in various coating compositions such as photoresist compositions and as precursors to heat resistant epoxy resins for use as laminate materials. Moreover, they are compatible with conventional novolak resins and other resins including other phenolic resins to provide new polymer mixtures exhibiting excellent film forming and thermal properties. Where the glass transition temperature of the new resins of the invention and other resins used in combination with those of the invention are known, resin blends are readily prepared exhibiting any desired intermediate glass transition temperature by adjustment of the concentration of each resin in the blend.

DESCRIPTION OF THE PREFERRED EMBODIMENTS

The aromatic novolak resins of the invention are acid catalyzed condensation products of one or more phenols and an aromatic aldehyde formed by the condensation of the reactants in the presence of a strong acid and a divalent sulfur compound as a catalyst. The phenol is of the type conventionally used in the formation of novolak resins, such as, for example, phenol itself, the cresols, xylenols, resorcinols, naphthols and bisphenols such as 4,4-isopropylidenediphenol. Preferred phenols for purposes of the invention include the cresols and 2,6-bis(hydroxymethyl)-p-cresol, m-cresol being most preferred.

The aromatic novolak is one formed by condensation of the phenol with an aromatic aldehyde. The aromatic aldehyde is preferably one conforming to the following formula:

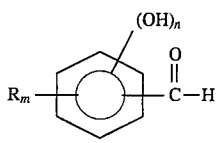

where R is a member selected from the group consisting of halogen, cyano, nitro, carboxyl, alkoxy or alkyl having from 1 to 5 carbon atoms; m is an integer ranging between 0 and 2 and n is a whole integer ranging between 0 and 3. Preferred aromatic aldehydes are those where a hydroxyl group is in a position ortho to the carbonyl group. Most preferred aromatic aldehydes are salicylaldehyde, benzaldehyde and mixtures of the two. Other aromatic aldehydes suitable for purposes of the invention include 2-chlorobenzaldehyde, 3-hydroxy benzaldehyde, 4-hydroxy benzaldehyde, 2-methoxy benzaldehyde, 3-nitro benzaldehyde, etc. Mixtures of aromatic aldehydes may also be used. In a lesser preferred embodiment, the aromatic aldehyde may be mixed with formaldehyde or a formaldehyde precursor such as paraformaldehyde if desired. However, the aromatic aldehyde preferably is in molar excess of formaldehyde, more preferably comprises at least 90% by weight and most preferably is the only aldehyde used to form the resin.

The aromatic novolak resins of the invention are formed by condensing the aromatic alcohol with the aromatic aldehyde in the presence of a strong acid and a divalent sulfur compound as a catalyst. The molar concentration of the aromatic aldehyde may be slightly less than that of the aromatic alcohol, but unexpectedly, may also be equivalent to or slightly in excess of the aromatic alcohol without formation of a cross linked resin. In this respect, the ratio of the phenol to the aldehyde may vary between about 1.1 to 1.0 and 1.0 to 1.1.

Aromatic aldehydes, compared to formaldehyde, are less reactive towards condensation reactions leading to polymerization. However, under more vigorous reaction conditions, aromatic aldehydes can condense with a reactive phenol in the presence of a strong mineral or organic acid such as sulfuric acid or toluene sulfonic acid. Generally, the polymers produced by this procedure are of low molecular weight, possess poor physical and mechanical properties and are generally unsuitable for lithographic properties. However, it is a discovery of this invention that by using catalytic amounts of ionizable compounds of divalent sulfur such as sulfur dichloride, sodium thiosulfate, hydrogen sulfide, sodium sulfide, thiols, thiophenols, thioacetic acid, thioglycolic acid, mercapto alkyl sulfonic acid or hydroxyalkyl thiols in conjunction with a strong mineral or organic acid catalyst such as sulfuric acid or toluene sulfonic acid, the condensation of the aromatic aldehyde with a reactive phenol results in the formation of polymers that are of high molecular weight, and therefore, are more suitable as resins for coating compositions, especially for photoresist coating compositions.

Whereas in the prior art, aromatic aldehydes could not be reacted with phenols to produce resins having weight average molecular weights in excess of about 1000 Daltons, in accordance with the subject invention, aromatic novolak resins can be formed having weight average molecular weights in excess of 1500 Daltons and typically in excess of 2500 Daltons. Further, with respect to molecular weight, it has been found that the molecular weight distribution of the resins produced in accordance with the invention have a narrow molecular weight distribution. In addition to increased molecular weight, the resins of the invention have improved glass transition temperatures generally in excess of 125° C. and often in excess of 175° C. Though not wishing to be bound by theory, it is believed that the improved thermal properties of the resin are due to strong hydrogen bonding and a more rigid polymer backbone.

The aromatic novolak resins of the invention are formed by mixing the reactants and a dehydrating solvent in a reactor and refluxing the mixture at an elevated temperature for a period of time sufficient to form a polymer of at least the weight average molecular weight given above. The reactor may be any conventional condensation reactor equipped with an agitator, means for reflux and distillation and conventional heat transfer means as required to perform the reaction. In general, a preferred method for carrying out the condensation reaction is to dissolve the condensation agent (the aromatic aldehyde) and the aromatic alcohol in an appropriate dehydrating water miscible solvent and then add the acid catalyst and ionizable divalent sulfur compound as described above. The resultant mixture is agitated and heated to reflux over a period of time ranging from about 2 to 24 hours, during which the aromatic alcohol and the aldehyde condense. The condensation reaction typically involves the formation of low molecular weight intermediates which initially form and then combine with each other at a later stage to form higher molecular weight polymers.

Following reflux, excess water is removed from the condensate and the condensate is then subjected to distillation at a temperature of from 130° to 180° C. to complete the condensation reaction. The resin solution is then typically diluted with more solvent and added to excess water to precipitate the resin. The resin is then washed with water and dried at elevated temperature under vacuum. The resin will have a glass transition temperature of at least 125° C.

In accordance with the invention, if desired, the aromatic novolak resin may be blended with other phenolic resins such as conventional novolak resins, polyvinyl phenol resins, pyrogallol-acetone condensates or any other phenolic resins known to the art. The ratio of the aromatic novolak to the additional phenolic resin can vary within wide limits and is, in part, dependent upon the desired glass transition temperature and other desired properties of the resin blend. Preferably, the aromatic novolak resin is present in the blend in an amount of at least 10 percent by weight, more preferably in predominant proportion, and most preferably in an amount that varies from 80 to 100 percent by weight of the blend. Other additives may be present in the resin blend as would be obvious to those skilled in the art.

The method of forming a blend of the aromatic novolak with another phenolic resin is not critical and is not considered to be a part of the invention. The two resins, in finely divided powder form or in solution may be mixed with each other using methods known to the art.

The following examples will better illustrate the invention.

EXAMPLE 1

A m-Cresol Salicylaldehyde Resin

A mixture of 183.2 grams salicylaldehyde, 162.2 grams m-cresol, 5.0 grams 3-mercaptopropionic acid, 1.5 grams of a 50 percent aqueous solution of p-toluene sulfonic acid and 200 m of glacial acetic acid were charged into a 1-liter reaction vessel equipped with a paddle stirrer, reflux condenser and a nitrogen inlet tube. The mixture was heated to reflux and maintained at reflux for 16 hours. The reaction mixture was slowly poured into 7 liters of deionized water to precipitate the resin. Once the solvent had exchanged with water, the product was collected on a filter, slurried once in warm deionized water for about 30 minutes, again collected, rinsed with water and dried in a vacuum oven under about 125 mn Hg and at about 100° to 105° C. About 268 grams of a brown powder was obtained.

EXAMPLE 2

A m-Cresol Salicylaldehyde Resin—Additional Example

A mixture of 184.1 grams of salicylaldehyde, 162.2 grams of m-cresol, 5.0 grams of 3-mercaptopropionic acid, 1.5 grams of p-toluenesulfonic acid and 200 ml of glacial acetic acid were charged into a 1-liter reactor vessel equipped with a paddle stirrer, reflux condenser and a nitrogen inlet tube. The mixture was heated to reflux and maintained at reflux for 7.5 hours. The reaction mixture was slowly added to a 7 liter flask of deionized water to precipitate the resin. Once the solvent had exchanged with water, the product was collected on a filter, slurried in warm deionized water for 30 minutes, again collected, rinsed with water and dried in a vacuum oven under 125 mm Hg and at about 105° to 110° C. About 297 grams of a brown powder having a weight average molecular weight of 4,138 Daltons and a polydispersity of 2.1 was collected. Due to the nature of the primary and secondary structure of the resin, its glass transition temperature could not be determined from the differential scanning calorimetry melting curve but it can be stated that it possessed a glass transition temperature in excess of 150° C. EXAMPLE 3

An O-Cresol Salicylaldehyde Resin

A mixture of 183.6 grams of salicylaldehyde, 162.2 grams of o-cresol, 3.0 grams of 3-mercaptopropionic acid, 1 grams of p-toluenesulfonic acid monohydrate and 75 ml of bis(2-methoxyethyl)ether were charged into a 1 liter reaction vessel equipped with a paddle stirrer, reflux condenser and a nitrogen inlet tube. The mixture was heated to reflux and maintained at reflux for 4.0 hours. The more volatile components in the reaction mixture were then removed by distillation at ambient pressure under a constant flow of nitrogen. The mixture temperature was then raised and maintained between 170° and 178° C. for 2 hours to complete the reaction. Upon cooling, the product mixture was diluted first with 150 ml of glacial acetic acid followed by 300 ml of methanol. The solution was slowly added to 3.2 liters of deionized water to precipitate the resin. Once the solvent had exchanged with water, the product was collected on a filter, slurried in warm deionized water, rinsed with water and dried in a vacuum oven under about 125 mm Hg and at about 115° to 120° C. About 289 grams of a brown powder having a weight average molecular weight of 19,439 Daltons and a polydispersity of 7.32 was obtained. Due to the nature of the primary and secondary structure of the resin, its glass transition temperature could not be determined from the differential scanning calorimetry melting curve but it can be stated that its glass transition temperature exceeded 150° C.

EXAMPLE 4

A p-Cresol Salicylaldehyde Resin

A mixture of 183.2 grams of salicylaldehyde, 162.2 grams of p-cresol, 3.0 grams of 3-mercaptopropionic acid, 1.1 grams of p-toluenesulfonic acid monohydrate and 75 ml of bis(2-methoxyethyl)ether were charged into a 1-liter reactor vessel equipped with a paddle stirrer, reflux condenser and a nitrogen inlet tube. The reaction was carried out according to the procedure of Example 3 to yield about 272.5 grams of resin having a weight average molecular weight of 11,622 Daltons and a polydispersity of 7.39. Due to the nature of the primary and secondary structure of the resin, its glass transition temperature could not be determined from the differential scanning calorimetry melting curve but it can be stated that its glass transition temperature exceeded 150° C.

EXAMPLE 5

A m-Cresol Salicylaldebyde Benzaldehyde Resin

A mixture of 778.6 grams of salicylaldehyde, 453.1 grams of benzaldehyde, 357.8 grams of m-cresol, 14.5 grams of 3-mercaptopropionic acid, 9.6 grams of p-toluenesulfonic acid monohydrate and 650 ml of propionic acid were charged into a 4 liter reaction vessel equipped with a paddle stirrer, reflux condenser and a nitrogen inlet tube. The mixture was heated to reflux and maintained at reflux for 4.0 hours. The more volatile components in the reaction mixture were then removed by distillation at ambient pressure under a constant flow of nitrogen. The mixture temperature was then raised and maintained between 145° C. and allowed to reflux for 4 hours to complete the reaction. Upon dilution with 1.6 liters of propionic acid, the resin solution was precipitated into 14 liters of deionized water. The product was collected on a filter, slurried in 14 liters of deionized water, collected by filtration, rinsed with deionized water and dried at 110® to 115° C. About 1,485 grams of a brown powder having a weight average molecular weight of 1,790 Daltons and a polydispersity of 1.95 was obtained having a glass transition temperature of about 177° C.

EXAMPLE 6

A m-Cresol, Salicylaldehyde, 2,6-bis(hydroxy-methyl)-p-Cresol Resin

A mixture of 146.0 grams m-cresol, 146.5 grams salicylaldehyde, 25.2 grams 2,6-bis(hydroxymethyl)-p-cresol, 5.0 grams 3 mercaptoproprionic acid and 1.5 grams p-toluenesulfonic acid monohydrate in 200 ml glacial acetic acid was reacted as described in Example 1 and about 281 grams of resin was obtained. The resin had a glass transition temperature of 233° C. and a molecular weight of about 4,085 Daltons with a weight average molecular weight to a number average molecular weight of 2.77.

EXAMPLE 7–21

Misc. Cresol Aromatic Aldehyde Resins

Following generally the procedures of Example 1 to 5, additional polymers were prepared using various combinations of monomers. The monomers, their mole ratio and the glass transition temperature and weight average molecular weight of the polymers formed are set forth in the following table:

| Example No. | Monomers | Mole % | Tg. °C. | Molecular Weight Average |
|---|---|---|---|---|
| 7 | m-Cresol | 50 | 152 | 2,023 |
|   | Benzaldehyde | 50 |   |   |
| 8 | m-Cresol | 50 | None obs. | 4,138 |
|   | Salicylaldehyde | 50 |   |   |
| 9 | m-Cresol | 50 | 164 | 3,038 |
|   | Benzaldehyde | 45 |   |   |
|   | Salicylaldehyde | 5 |   |   |
| 10 | m-Cresol | 50 | 166 | 2,610 |
|   | Banzaldehyde | 40 |   |   |
|   | Salicylaldehyde | 10 |   |   |
| 11 | m-Cresol | 50 | 147 | 1,962 |
|   | Benzaldehyde | 38 |   |   |
|   | Salicylaldehyde | 12 |   |   |
| 12 | m-Cresol | 50 | nm | 2,001 |
|   | Banzaldehyde | 36.6 |   |   |
|   | Salicylaldehyde | 13.3 |   |   |
| 13 | m-Cresol | 50 | nm | 2,317 |
|   | Benzaldehyde | 36 |   |   |
|   | Salicylaldehyde | 14 |   |   |
| 14 | m-Cresol | 50 | 147 | 1,999 |
|   | Benzaldehyde | 35 |   |   |
|   | Salicylaldehyde | 15 |   |   |
| 15 | m-Cresol | 50 | 161 | 2.319 |
|   | Benzaldehyde | 25 |   |   |
|   | Salicylaldehyde | 25 |   |   |
| 16 | m-Cresol | 50 | 189 | 2,826 |
|   | Benzaldehyde | 17 |   |   |
|   | Salicylaldehyde | 33 |   |   |
| 17 | o-Cresol | 50 | 125 | 4,328 |
|   | Banzaldehyde | 30 |   |   |
|   | Salicylaldehyde | 20 |   |   |
| 18 | o-Cresol | 50 | 132 | 4,446 |
|   | Benzaldehyde | 25 |   |   |
|   | Salicylaldehyde | 25 |   |   |
| 19 | o-Cresol | 50 | 134 | 6,610 |
|   | Benzaldehyde | 20 |   |   |
|   | Salicylaldehyde | 30 |   |   |
| 20 | m-Cresol | 43.3 | 133 | 1,667 |
|   | p-Cresol | 13.3 |   |   |
|   | Benzaldehyde | 26 |   |   |
|   | Salicylaldehyde | 24 |   |   |
| 21 | m-Cresol | 43.3 | 131 | 3,041 |
|   | o-Cresol | 13.3 |   |   |
|   | Benzaldehyde | 26 |   |   |
| 22 | m-Cresol | 33 | 138 | 2,007 |
|   | o-Cresol | 17 |   |   |
|   | Benzaldehyde | 30 |   |   |
|   | Salicylaldehyde | 20 |   |   |
| 23 | m-Cresol | 25 | 125 | 2,343 |
|   | o-Cresol | 25 |   |   |
|   | Benzaldehyde | 30 |   |   |
|   | Salicylaldehyde | 20 |   |   |
| 24 | m-Cresol | 17 | 131 | 2,564 |
|   | o-Cresol | 33 |   |   |
|   | Benzaldehyde | 30 |   |   |
|   | Salicylaldehyde | 20 |   |   |
| 25 | o-Cresol | 50 | 132 | 4,446 |
|   | Salicylaldehyde | 25 |   |   |
|   | Benzaldehyde | 25 |   |   |
| 26 | m-Cresol | 33 | 138 | 2,007 |
|   | o-Cresol | 17 |   |   |
|   | benzaldehdye | 30 |   |   |
|   | salicylaldehyde | 20 |   |   |
| 27 | m-Cresol | 43.3 | 133 | 1,667 |
|   | p-Cresol | 13.3 |   |   |
|   | Benzaldehyde | 26 |   |   |
|   | Salicylaldehyde | 24 |   |   |
| 28 | m-Cresol | 50 | 147 | 1,671 |
|   | 3-Hydroxybenz-aldehyde | 50 |   |   |
| 29 | m-Cresol | 50 | nm | 1,451 |
|   | 4-Hydroxybenz-aldehyde | 50 |   |   |

EXAMPLE 30 to 32

Aromatic Novolak—Conventional Novolak Blends

This example exemplifies resin blends using the resin of Example 7 (Resin A) with a conventional cresol formaldehyde novolak resin (Resin B) having a glass transition temperature of 94° C.

The resin blends were prepared by adding the appropriate amount of each resin to a common flask, dissolving the two resins in methanol and then evaporating the solvent under reduced pressure. The resin blend was then raised to a temperature of between 70° and 80° C. under vacuum to remove remaining solvent. The molar ratio of Resin A to Resin B and the resultant glass transition temperature are set forth in the following table.

| Resin A to Resin B | Tg. °C. |
|---|---|
| 3 to 1 | 140 |
| 1 to 1 | 114 |
| 1 to 3 | 101 |

The following examples are comparative examples to better illustrate the advantages of the invention.

EXAMPLE 33

A Mixed Cresol Formaldehyde Novolak
[Comparative]

A 2-L four-neck resin kettle equipped with a stirrer, heating source, thermometer, variable reflux ratio distilling head and a nitrogen inlet tube was charged with 278.3 g meta-cresol, 335.5 g para-cresol, 34.3 g ortho-cresol, 68.3 g of 36.9 percent formaldehyde, 20 mL of deionized water and 12.0 g of oxalic acid dihydrate. The mixture was heated to about 60° C. at which point an exothermic condensation reaction ensued. When the reaction mixture temperature reached about 100° C. 273.3 g of 36.9 percent formaldehyde was added in about 30 minutes. The reaction was then allowed to continue for about 4 hours at reflux temperature. The more volatile components in the reaction mixture were removed by distillation at ambient pressure under a constant flow of nitrogen. When the temperature of the reaction mixture reached about 220° C. a partial vacuum pressure was applied and was gradually increased until a maximum vacuum of 7 mm Hg was achieved and the mixture was at about 228° C. The liquified resin remaining in the kettle was poured into a tray under nitrogen and allowed to cool and solidify. About 516 g of novolak resin having a glass transition temperature of about 100° C. was obtained.

EXAMPLE 34

A m-Cresol Benzaldehyde Resin Formed Without A Divalent Sulfur Compound

A mixture of 159.2 grams of benzaldehyde, 162.2 grams of m-cresol and 1.7 grams of 50% p-toluenesulfonic acid monohydrate solution were charged into a 0.5 liter reaction vessel equipped with paddle stirrer, reflux condenser and a nitrogen inlet tube. The mixture was heated to and kept at reflux for about 4 hours. The more volatile components in the reaction mixture were then removed by distillation at ambient pressure under a constant flow of nitrogen. When the reaction mixture temperature reached 220° C., the system was slowly placed under full vacuum to complete the distillation. The resin melt was then decanted from the reactor and cooled to yield about 245 grams of a brown solid having a glass transition temperature of 124° C. and a weight average molecular weight of 1,296 Daltons with a polydispersity of 1.45. Repetition of the procedure adding 2 grams of 3-mercaptopropionic acid produces 276 grams of resin with a molecular weight of 2,023 and a glass transition temperature of 152° C.

I claim:

1. An alkali soluble novolak resin formed by condensation of aldehyde and a phenol where at least 50 mole percent of the aldehyde is aromatic, said novolak resin having a weight average molecular weight in excess of 1500 Daltons and a glass transition temperature in excess of 125° C.

2. The novolak resin of claim 1 where the phenol is selected from the group consisting of phenol itself, a cresol, a xylenol, a naphthol, a bisphenol and mixtures thereof.

3. The novolak of claim 1 wherein at least 90 mole percent of the aldehyde is romatic.

4. The novolak resin of claim 1 where essentially all of the aldehyde is aromatic.

5. The novolak resin of claim 4 where the aromatic aldehyde corresponds to the following formula:

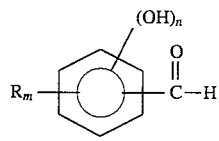

where R is a member selected from the group consisting of halogen, cyano, nitro, carboxyl, alkoxy and alkyl having from 1 to 5 carbon atoms; m is an integer ranging between 0 and 2 and n is a whole integer ranging between 0 and 3.

6. A novolak resin comprising the product resulting from the acid condensation of a phenol and an aromatic aldehyde in the presence of an effective amount of a divalent sulfur compound to increase the molecular weight of the novolak resin formed, said aromatic aldehyde conforming to the formula:

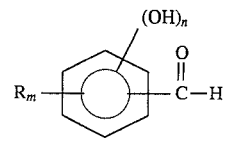

where R is a member selected from the group consisting of halogen, cyano, nitro, carboxyl, alkoxy and alkyl having from 1 to 5 carbon atoms; m is an integer ranging between 0 and 2 and n is a whole integer ranging between 0 and 3 and a phenol, said novolak resin having a weight average molecular weight in excess of 1500 Daltons and a glass transition temperature in excess of 125° C.

7. The novolak resin of claim 6 where the phenol is a cresol.

8. The novolak resin of claim 6 where the phenol is a cresol and the aldehyde is a member selected from the group consisting of benzaldehyde, salicylaldehyde and mixtures thereof.

9. The novolak resin of claim 8 where the aldehyde is benzaldehyde.

10. The novolak resin of claim 8 where the aldehyde is salicylaldehyde.

11. The novolak resin of claim 2 where the phenol is a cresol.

12. The novolak resin of claim 5 where the aromatic aldehyde is a mixture of benzaldehyde and salicylaldehyde.

13. The novolak resin of claim 6 where the aromatic aldehyde is a mixture of benzaldehyde and salicylaldehyde.

* * * * *